United States Patent
Liao et al.

(10) Patent No.: US 11,643,544 B2
(45) Date of Patent: May 9, 2023

(54) RESIN COMPOSITION, AND PREPREG, METAL-CLAD LAMINATE, AND PRINTED CIRCUIT BOARD PREPARED USING THE SAME

(71) Applicant: TAIWAN UNION TECHNOLOGY CORPORATION, Chupei (TW)

(72) Inventors: Chih-Wei Liao, Chupei (TW); Ju-Ming Huang, Chupei (TW); Guan-Syun Tseng, Chupei (TW)

(73) Assignee: TAIWAN UNION TECHNOLOGY CORPORATION, Chupei (TW)

( * ) Notice: Subject to any disclaimer, the term of this patent is extended or adjusted under 35 U.S.C. 154(b) by 317 days.

(21) Appl. No.: 16/133,083

(22) Filed: Sep. 17, 2018

(65) Prior Publication Data

US 2019/0241733 A1  Aug. 8, 2019

(30) Foreign Application Priority Data

Feb. 5, 2018  (TW) .................. 107103998

(51) Int. Cl.
| | |
|---|---|
| C08L 63/00 | (2006.01) |
| H05K 1/03 | (2006.01) |
| C08K 5/3492 | (2006.01) |
| C08K 3/36 | (2006.01) |
| C08K 3/22 | (2006.01) |
| C08K 3/28 | (2006.01) |
| C08K 5/00 | (2006.01) |
| C08J 5/24 | (2006.01) |
| C08K 5/42 | (2006.01) |
| C08K 5/18 | (2006.01) |

(52) U.S. Cl.
CPC .............. *C08L 63/00* (2013.01); *C08J 5/244* (2021.05); *C08J 5/249* (2021.05); *C08K 3/22* (2013.01); *C08K 3/28* (2013.01); *C08K 3/36* (2013.01); *C08K 5/0066* (2013.01); *C08K 5/3492* (2013.01); *H05K 1/0373* (2013.01); *C08J 2363/02* (2013.01); *C08K 5/18* (2013.01); *C08K 5/42* (2013.01); *C08L 2201/02* (2013.01); *C08L 2203/20* (2013.01)

(58) Field of Classification Search
CPC ..... C08L 63/00; H05K 1/0373; C08K 5/3492; C08K 3/36; C08K 3/22; C08K 5/0066; C08K 3/28; C08K 5/42
See application file for complete search history.

(56) References Cited

U.S. PATENT DOCUMENTS

| | | | | |
|---|---|---|---|---|
| 2010/0143728 A1* | 6/2010 | Tsuchikawa | ........... | C08G 73/12 |
| | | | | 428/457 |
| 2014/0073721 A1* | 3/2014 | Yaginuma | ............. | H01L 23/295 |
| | | | | 523/451 |

FOREIGN PATENT DOCUMENTS

| TW | 201247853 A | 12/2012 |
|---|---|---|
| TW | 201731830 A | 9/2017 |
| WO | WO2017077846 A1 | 5/2017 |

OTHER PUBLICATIONS

Machine Translation of WO 2017077846 (2017) (Year: 2017).*
PatentScope machine translation of WO 2017/077846, https://patentscope.wipo.int/search/en/detail.jsf?docId=WO2017077846&_cid=P12-L3VVV0-94510-1 (Year: 2017).*
Taiwanese Office Action from corresponding Taiwanese Patent Application No. 107103998, dated Sep. 12, 2018.

* cited by examiner

*Primary Examiner* — Callie E Shosho
*Assistant Examiner* — Bethany M Miller
(74) *Attorney, Agent, or Firm* — Greer, Burns & Crain, Ltd

(57) ABSTRACT

A resin composition is provided. The resin composition includes the following constituents:
  (A) an epoxy resin;
  (B) an amino group-containing hardener; and
  (C) a compound of formula (I),

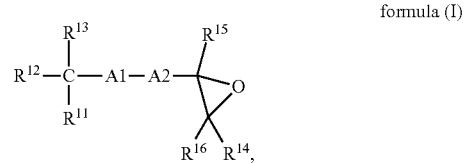

formula (I)

wherein, $R^{11}$ to $R^{16}$ and A1 to A2 in formula (I) are as defined in the specification, and the amount of the compound (C) of formula (I) is about 10 parts by weight to about 85 parts by weight per 100 parts by weight of the epoxy resin (A).

10 Claims, No Drawings

RESIN COMPOSITION, AND PREPREG, METAL-CLAD LAMINATE, AND PRINTED CIRCUIT BOARD PREPARED USING THE SAME

CLAIM FOR PRIORITY

This application claims the benefit of Taiwan Patent Application No. 107103998 filed on Feb. 5, 2018, the subject matters of which are incorporated herein in their entirety by reference.

BACKGROUND

Field of the Invention

The present invention provides a resin composition, especially, an epoxy resin-based resin composition that can provide electronic materials with excellent thermal resistance and processability. The resin composition of the present invention can be used in combination with glass fibers to constitute a composite material or prepreg, and furthermore can be used as a metal foil adhesive to manufacture a laminate and printed circuit board.

Descriptions of the Related Art

As applications of electronic products have recently entered high-frequency and high-speed applications, the requirements on the physicochemical properties of electronic materials have become stricter. Conventional electronic materials are failing to keep up with the trends of high-frequency and high-speed signal transmission, miniaturization of electronic components, and high-density wiring of printed circuit boards, and especially the requirements on low dielectric properties of electronic materials. Furthermore, since the density of wirings of circuit boards continually increases, the diameter of micro holes and the pitch between micro holes for the interlayer connection in multi-layered circuit boards need to be smaller. As a result, the requirements on the drilling processability of circuit boards have become stricter. In addition, with the development of lead-free processes for printed circuit boards, the requirements on thermal resistance and warpage of the dielectric layer material of metal-clad laminates for preparing printed circuit boards have become stricter to keep up with higher processing temperatures. Therefore, a method in preparing electronic materials with satisfactory characteristics, including electrical properties, thermal resistance, and drilling processability, is still a technical problem to be solved.

In view of this, WO 2017/077846 A1 discloses a diluent for epoxy resins, which can modify epoxy resins to obtain a resin composition with good operability. The document discusses the influence of the carbon numbers of branched alkyl of the diluent on solubility and viscosity. In particular, it addresses using anhydride hardeners. However, the electronic material prepared in accordance with WO 2017/077846 A1 does not have satisfactory glass transition temperature (Tg).

SUMMARY

In view of the technical problems mentioned above, the present invention provides a resin composition in manufacturing electronic materials with high glass transition temperature (Tg), superior thermal resistance, superior electrical properties (low dielectric constant (Dk) and low dissipation factor (Df)), superior drilling processability, good dimensional stability, and low warpage.

As illustrated in the following objectives, one of the technical means of the present invention is to use a compound with a specific structure and an amino group-containing hardener together in an epoxy resin-based resin composition to provide electronic materials with advantages mentioned above, especially with improved thermal resistance and drilling processability.

An objective of the present invention is to provide a resin composition, which comprises the following constituents:
(A) an epoxy resin;
(B) an amino group-containing hardener; and
(C) a compound of the following formula (I):

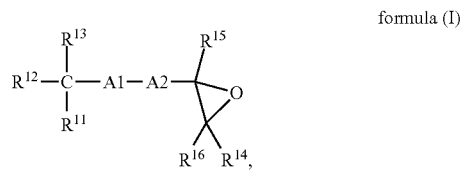

formula (I)

in formula (I),
$R^{11}$ is H or a $C_1$ to $C_{25}$ alkyl, $R^{12}$ and $R^{13}$ are independently a $C_2$ to $C_{27}$ alkyl, and the total carbon number of —$CR^{11}R^{12}R^{13}$ is 10 to 30;
$R^{14}$, $R^{15}$ and $R^{16}$ are independently H or a $C_1$ to $C_{10}$ alkyl;
A1 is *—C(=O)O— (an ester group), *—CH$_2$O— (an ether group), or *—CH$_2$OC(=O)—, wherein * indicates the end bonded to —$CR^{11}R^{12}R^{13}$; and
A2 is a covalent bond or a $C_1$ to $C_8$ alkylene with or without an ether bond,
wherein based on 100 parts by weight of the epoxy resin (A), the amount of the compound (C) of formula (I) ranges from about 10 parts by weight to about 85 parts by weight.

In some embodiments of the present invention, the amino group-containing hardener (B) is an aromatic compound containing at least one amino group, for example, the amino group-containing hardener (B) can be selected from the group consisting of diamino diphenylsulfone (DDS), diamino diphenylmethane (DDM), amino triazine novolac (ATN) resins, guanamine, and combinations thereof. An example of guanamine is 6-substituted guanamine, such as benzo-guanamine, aceto-guanamine, or caprino-guanamine.

In some embodiments of the present invention, the amino group-containing hardener (B) is dicyandiamide (DICY) while the epoxy resin (A) is a multi-functional epoxy resin.

In some embodiments of the present invention, the resin composition further comprises a co-hardener selected from the group consisting of cyanate ester resins, phenol novolac (PN), bismaleimide (BMI) resins, benzoxazine resins, active esters, styrene-vinyl phenol copolymers, and combinations thereof.

In some embodiments of the present invention, the resin composition further comprises a hardening promoter.

In some embodiments of the present invention, the resin composition further comprises a filler selected from the group consisting of silica (e.g., hollow silica), aluminum oxide, magnesium oxide, magnesium hydroxide, calcium carbonate, talc, clays, aluminum nitride, boron nitride, aluminum hydroxide, silicon aluminum carbide, silicon carbide, sodium carbonate, titanium dioxide, zinc oxide, zirconium oxide, quartzes, diamonds, diamond-like carbon, graphites, calcined kaolin, pryan, micas, hydrotalcite, polytetrafluoroethylene (PTFE) powders, glass beads, ceramic whiskers, carbon nanotubes, nanosized inorganic powders, and combinations thereof.

In some embodiments of the present invention, the resin composition further comprises an additive selected from the group consisting of dispersing agents, tougheners, flame retardants, and combinations thereof.

Another objective of the present invention is to provide a prepreg, which is prepared by impregnating a substrate with the aforementioned resin composition or by coating the aforementioned resin composition onto a substrate and drying the impregnated or coated substrate.

Yet another objective of the present invention is to provide a metal-clad laminate, which is prepared by laminating the aforementioned prepreg and a metal foil or is prepared by coating the aforementioned resin composition onto a metal foil and drying the coated metal foil.

Still another objective of the present invention is to provide a printed circuit board, which is prepared from the aforementioned metal-clad laminate.

To render the above objectives, the technical features and advantages of the present invention more apparent, the present invention will be described in detail with reference to some embodiments hereinafter.

DETAILED DESCRIPTION

Hereinafter, some embodiments of the present invention will be described in detail. However, without departing from the spirit of the present invention, the present invention may be embodied in various embodiments and should not be limited to the embodiments described in the specification.

Unless it is additionally explained, the expressions "a," "the," or the like recited in the specification (especially in the claims) should include both the singular and the plural forms.

Unless it is additionally explained, while describing the constituents in the solution, mixture and composition in the specification, the amount of each constituent is calculated based on the dry weight, i.e., regardless of the weight of the solvent.

As used herein, the term "about" means that the designated amount may increase or decrease a magnitude that is general and reasonable to persons skilled in the art.

One of the technical features of the present invention is to combine the epoxy resin with the aforementioned compound with a specific structure and the amino group-containing hardener. Compared to common formulations using anhydride-type hardeners, the resin composition of the present invention could provide electronic materials with better thermal resistance without sacrificing the physicochemical properties and electrical properties of the electronic materials. Thus, the resin composition of the present invention can solve the defects in conventional resin compositions. Furthermore, the electronic materials manufactured by the resin composition of the present invention are also provided with good drilling processability and dimensional stability.

Resin Composition

The resin composition of the present invention comprises essential constituents including an epoxy resin (A), an amino group-containing hardener (B), and a compound (C) of formula (I), and optional constituent(s) (D). The detailed description for each constituent is provided below.

Epoxy Resin (A)

As used herein, an epoxy resin refers to a thermosetting resin with at least two epoxy functional groups in a molecule, such as a bifunctional epoxy resin, a tetrafunctional epoxy resin, an octofunctional epoxy resin, or a linear phenolic epoxy resin. In the resin composition of the present invention, the type of the epoxy resin is not particularly limited, and persons with ordinary skill in the art can select the type of the epoxy resin depending on the need after reading the disclosure of the present invention. For example, in consideration of the flame retardance of the resin composition, a bromine-containing epoxy resin can be used, or a phosphorus-containing compound may be introduced into epoxy resin to provide a phosphorus-containing epoxy resin, such as an epoxy resin that is modified by 9,10-dihydro-9-oxa-10-phosphahenanthrene-10-oxide (DOPO). In consideration of thermal resistance of the manufactured electronic material, an epoxy resin with high glass transition temperature can be used.

Epoxy resins suitable for the present invention include phenolic epoxy resins, diphenylethylene epoxy resins, fluorene skeleton-containing epoxy resins, triphenol methane epoxy resins, biphenyl epoxy resins, biphenyl aralkyl epoxy resins, naphthalene epoxy resins, and dicyclopentadiene (DCPD) epoxy resins. Phenolic epoxy resins include, for example, phenol phenolic epoxy resins, cresol phenolic epoxy resins, bisphenol A phenolic epoxy resins, and bisphenol F phenolic epoxy resins.

Specific examples of the epoxy resin suitable for the present invention include but are not limited to 1,4-butanediol diglycidyl ether, 1,6-hexanediol diglycidyl ether, (poly) ethylene glycol diglycidyl ether, (poly)propylene glycol diglycidyl ether, trimethylolethane triglycidyl ether, trimethylolpropane triglycidyl ether, 1,4-cyclohexane dimethanol diglycidyl ether, 1,2-epoxy-4-(epoxy ethyl)cyclohexane, glycerol triglycidyl ether, diglycerol polydiglycidyl ether, 2,6-diglycidyl phenyl glycidyl ether, 1,1,3-tris(4-glycidyloxy phenyl)propane, 1,2-cyclohexane dicarboxylic acid diglycidyl ester, 4,4'-methylene bis(N,N-diglycidyl aniline), 3,4-epoxycyclohexane carboxylic acid-3',4'-epoxy cyclohexyl formate, triglycidyl p-amino phenol, tetraglycidyl m-xylylene diamine, tetraglycidyl diamino diphenyl methane, tetraglycidyl-1,3-bisaminomethylcyclohexane, bisphenol A diglycidyl ether, bisphenol S diglycidyl ether, tetrabromobisphenol A diglycidyl ether, hydrogenated bisphenol A diglycidyl ether, pentaerythritol diglycidyl ether, pentaerythritol tetraglycidyl ether, pentaerythritol polyglycidyl ether, resorcinol diglycidyl ether, diglycidyl phthalate, diglycidyl tetrahydrophthalate, neopentyl glycol diglycidyl ether, bisphenol hexafluoro acetone diglycidyl ether, triglycidyl isocyanurate, tri(3,4-epoxybutyl) isocyanurate, tri(4,5-epoxypentyl) isocyanurate, tri(5,6-epoxyhexyl) isocyanurate, tri(7,8-epoxyoctyl) isocyanurate, tri(2-diglycidyloxy ethyl) isocyanurate, monoallyl isocyanurate diglycidyl ester, N,N'-diglycidyl-N"-(2,3-dipropionyloxy propyl) isocyanurate, N,N'-bis(2,3-dipropionyloxy propyl)-N"-glycidyl isocyanurate, tris(2,2-bis(glycidyloxy methyl)butyl)-3,3',3"-(2,4,6-trioxo-1,3,5-triazine-1,3,5-triyl) tripropionate, sorbitol polyglycidyl ether, diglycidyl adipate, dibromo phenyl glycidyl ether, 1,2,7,8-diepoxy octane, 1,6-dimethylol perfluorohexane diglycidyl ether, 4-(spiro[3,4-epoxy cyclohexane-1,5'-[1,3]dioxane]-2'-yl)-1,2-epoxy cyclohexane, 1,2-bis(3,4-epoxy cyclohexyl methyl)ethane, 4,5-epoxy-2-methyl cyclohexane carboxylic acid 4',5'-epoxy-2'-methyl cyclohexyl formate, ethylene glycol bis(3,4-epoxy cyclohexane carboxylate), bis(3,4-epoxy cyclohexyl methyl) adipate, and bis(2,3-epoxy cyclopentyl) ether.

The aforementioned epoxy resins can be used either alone or in combination depending on the need of persons with ordinary skill in the art. In some embodiments of the present invention, bisphenol A phenolic epoxy resins or epoxy resins with high glass transition temperature are used.

In the resin composition of the present invention, based on the dry weight of the resin composition, the amount of the epoxy resin (A) can range from about 15 wt % to about 60 wt %, and in particular from about 20 wt % to about 55 wt %, such as 22 wt %, 24 wt %, 25 wt %, 27 wt %, 28 wt %, 30 wt %, 32 wt %, 35 wt %, 36 wt %, 37 wt %, 39 wt %, 40 wt %, 42 wt %, 45 wt %, 46 wt %, 47 wt %, 50 wt %, 51 wt %, 52 wt %, or 54 wt %. When the amount of the epoxy resin (A) is within the designated ranges, the epoxy resin can give its full play to its advantages, which include, for example, giving the manufactured electronic materials good adhesion with metal foils and insulating properties, without affecting the characteristics of the other constituents of the resin composition.

Amino Group-Containing Hardener (B)

As used herein, amino group refers to a group obtained by removing one hydrogen atom from ammonia ($NH_3$), that is, $-NH_2$. The amino group-containing hardener can be an aromatic compound containing at least one amino group or a non-aromatic compound containing at least one amino group. Examples of the aromatic compound containing at least one amino group include but are not limited to diamino diphenylsulfone (DDS), diamino diphenylmethane (DDM), amino triazine novolac (ATN) resin, and guanamine. Examples of the non-aromatic compound containing at least one amino group include but are not limited to dicyandiamide (DICY), diethylenetriamine, triethylenetetramine, tetraethylenepentamine, diethylamino propylamine, N-aminoethyl piperazine, methane diamine, and isophorone diamine. In accordance with the present invention, it is preferable to use the aromatic compound containing at least one amino group. Without being restricted by any theories, it is believed that amino group-containing aromatic compounds have higher reactivity due to their chemical structure, which allows the resin composition to realize higher cross-linking density, so that the manufactured electronic materials can be provided with higher glass transition temperature (Tg).

Among amino group-containing aromatic compounds, guanamine can be one or more compounds represented by the following structural formula:

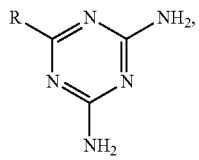

wherein R is H or a substituent rather than H. When R is H, the compound represented by the structural formula is called 2,4-diamino-1,3,5-triazine. When R is a substituent rather than H, such as amino, phenyl, or an alkyl (e.g., methyl), the compound represented by the structural formula is called a 6-substituted guanamine. Examples of the 6-substituted guanamine include but are not limited to benzo-guanamine (R is phenyl), aceto-guanamine (R is methyl), and caprino-guanamine (R is nonyl).

Diamino diphenylsulfone (DDS) belongs to aromatic amino-based hardeners. Examples of diamino diphenylsulfone include but are not limited to 3,3-diamino diphenylsulfone

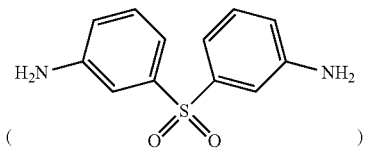 [SMILES: Nc1cccc(S(=O)(=O)c2cccc(N)c2)c1]

and 4,4-diamino diphenylsulfone

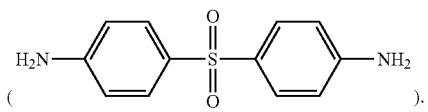 [SMILES: Nc1ccc(S(=O)(=O)c2ccc(N)cc2)cc1]

Diamino diphenylmethane (DDM) also belongs to aromatic amino-based hardeners. Examples of diamino diphenylmethane include but are not limited to 4,4-diamino diphenylmethane

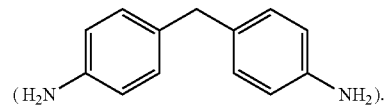 [SMILES: Nc1ccc(Cc2ccc(N)cc2)cc1]

Amino triazine novolac (ATN) resin can improve the thermal resistance of the manufactured electronic material and the adhesion between the dielectric layer and copper foil of the electronic material. Generally, ATN resin can be prepared by reacting a phenol compound, a guanamine compound, and an aldehyde compound in the presence of an acid catalyst (e.g., oxalic acid, p-toluenesulfonic acid). Examples of the phenol compound include but are not limited to phenol, cresol, and xylenol. Examples of the aldehyde compound include but are not limited to formaldehyde. Examples of the guanamine compound include those mentioned in the above. Examples of ATN resin include but are not limited to compounds represented by the following structural formula:

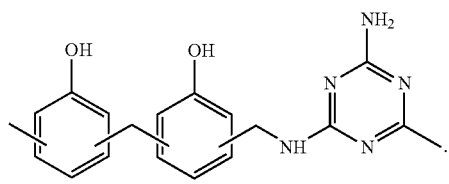

The aforementioned amino group-containing hardeners can be used either alone or in combination. Persons with ordinary skill in the art can select and match amino group-containing hardeners based on the ordinary skill depending on the need upon reading the disclosure of the present invention. In the appended Examples, DDS and DICY are used.

In the resin composition of the present invention, based on the dry weight of the resin composition, the amount of the amino group-containing hardener (B) can range from about 1 wt % to about 20 wt %, and in particular from about 5 wt % to about 15 wt %, such as 6 wt %, 7 wt %, 8 wt/%, 9 wt/%, 10 wt %, 11 wt %, 12 wt %, 13 wt %, or 14 wt %, but the present invention is not limited thereto.

Compound (C) Represented by Formula (I)

The resin composition of the present invention comprises a compound of formula (I):

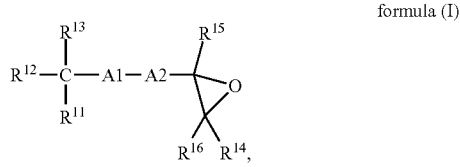

formula (I)

In formula (I), $R^{11}$ is H or a $C_1$ to $C_{25}$ alkyl, and preferably H. The $C_1$ to $C_{25}$ alkyl can be a linear alkyl, a branched alkyl, or an alicyclic alkyl. Examples of the linear alkyl include methyl, ethyl, propyl, butyl, amyl (pentyl), hexyl, heptyl, octyl, nonyl, decyl, undecyl, dodecyl, tridecyl, tetradecyl, pentadecyl, hexadecyl, heptadecyl, octadecyl, nonadecyl, icosyl, heneicosyl, docosyl, tricosyl, tetracosyl, and pentacosyl. Examples of the branched alkyl include isopropyl, isobutyl, sec-butyl, tert-butyl, isoamyl, neo-amyl, tert-amyl, isohexyl, thexyl, 4-methylhexyl, 5-methylhexyl, 2-ethylamyl, heptane-3-yl, heptane-4-yl, 4-methylhexane-2-yl, 3-methylhexane-3-yl, 2,3-dimethylpentane-2-yl, 2,4-dimethylpentane-2-yl, 4,4-dimethylpentane-2-yl, 6-methylheptyl, 2-ethylhexyl, octane-2-yl, 6-methylheptane-2-yl, 6-methyloctane, 3,5,5-trimethylhexyl, nonane-4-yl, 2,6-dimethylheptane-3-yl, 3,6-dimethylheptane-3-yl, 3-ethylheptane-3-yl, 3,7-dimethyloctyl, 8-methylnonyl, 3-methylnonane-3-yl, 4-ethyloctane-4-yl, 9-methyldodecyl, undecane-5-yl, 3-ethylnonane-3-yl, 5-ethylnonane-5-yl, 2,2,4,5,5-pentamethylhexane-4-yl, 10-methylundecyl, 11-methyldodecyl, tridecane-6-yl, tridecane-7-yl, 7-ethylundecane-2-yl, 3-ethylundecane-3-yl, 5-ethylundecane-5-yl, 12-methyltridecyl, 13-methyltetradecyl, pentadecane-7-yl, pentadecane-8-yl, 14-methylpentadecyl, 15-methylhexadecyl, heptadecane-8-yl, heptadecane-9-yl, 3,13-dimethylpentadecane-7-yl, 2,2,4,8,10,10-hexamethylundecane-5-yl, 16-methylheptadecyl, 17-methyloctadecyl, nonadecane-9-yl, nonadecane-10-yl, 2,6,10,14-tetramethylpentadecane-7-yl, 18-methylnonadecyl, 19-methylicosyl, heneicosane-10-yl, 20-methylheneicosyl, 21-methyldocosyl, tricosane-11-yl, 22-methyltricosyl, 23-methyltetracosyl, pentacosane-12-yl, pentacosane-13-yl, 2,22-dimethyltricosane-11-yl, 3,21-dimethyltricosane-11-yl, and 9,15-dimethyltricosane-11-yl. Examples of the alicyclic alkyl include but are not limited to cyclopropyl, cyclobutyl, cycloamyl, cyclohexyl, 4-tert-butyl cyclohexyl, 1,6-dimethylcyclohexy, menthyl, cycloheptyl, cyclooctyl, bicyclo[2.2.1]heptane-2-yl, bornyl, isobornyl, 1-adamantyl, 2-adamantyl, tricycle[5.2.1.0 2,6]decane-4-yl, tricycle[5.2.1.0 2,6]decane-8-yl, and cyclododecyl.

In formula (I), $R^{12}$ and $R^{13}$ are independently a $C_2$ to $C_{27}$ alkyl. The $C_2$ to $C_{27}$ alkyl can be a linear alkyl, a branched alkyl, or an alicyclic alkyl. Examples of the linear alkyl include hexacosyl, heptacosyl and those mentioned above. Examples of the branched alkyl include 24-methylpentacosyl, 25-methylhexacosyl, heptacosane-13-yl and those mentioned above. Examples of alicyclic alkyls include those mentioned above. In the preferred embodiments of the present invention, $R^{12}$ and $R^{13}$ are independently a $C_4$ to $C_{16}$ alkyl, and more preferably a $C_4$ to $C_{10}$ alkyl. In the preferred embodiments of the present invention, $R^{12}$ and $R^{13}$ are independently a branched alkyl. Specifically, it is preferred that $R^{12}$ and $R^{13}$ are independently hexyl, heptyl, octyl, nonyl, 4,4-dimethylpentane-2-yl, 6-methylheptane-2-yl, 6-methyloctyl, 3,5,5-trimethylhexyl, or 3,7-dimethyloctyl.

In formula (I), the total carbon number of $-CR^{11}R^{12}R^{13}$ ranges from 10 to 30, preferably from 14 to 26, and more preferably from 14 to 20. The preferred examples of $-CR^{11}R^{12}R^{13}$ include but are not limited to 3-methylnonane-3-yl, 4-ethyloctane-4-yl, undecane-5-yl, 3-ethylnonane-3-yl, 5-ethylnonane-5-yl, 2,2,4,5,5-pentamethylhexane-4-yl, 7-ethylundecane-2-yl, 3-ethylundecane-3-yl, 5-ethylundecane-5-yl, tridecane-6-yl, tridecane-7-yl, pentadecane-7-yl, pentadecane-8-yl, heptadecane-8-yl, heptadecane-9-yl, 3,13-dimethylpentadecane-7-yl, 2,2,4,8,10,10-hexamethylundecane-5-yl, nonadecane-9-yl, nonadecane-10-yl, 2,6,10,14-tetramethylpentadecane-7-yl, heneicosane-10-yl, tricosane-11-yl, pentacosane-12-yl, pentacosane-13-yl, 2,22-dimethyltricosane-11-yl, 3,21-dimethyltricosane-11-yl, and 9,15-dimethyltricosane-1-yl.

In formula (I), $R^{14}$, $R^{15}$ and $R^{16}$ are independently H or a $C_1$ to $C_{10}$ alkyl, and preferably H. Examples of the $C_1$ to $C_{10}$ alkyl include those mentioned above.

In formula (I), A1 is $*-C(=O)O-$, $*-CH_2O-$, or $*-CH_2OC(=O)-$, wherein $*$ indicates the end bonded to $-CR^{11}R^{12}R^{13}$. In the preferred embodiments of the present invention, A1 is $*-C(=O)O-$ or $*-CH_2O-$, and $*-C(=O)O-$ is particularly preferred.

In formula (I), A2 is a covalent bond or a $C_1$ to $C_8$ alkylene with or without an ether bond. The term "with or without an ether bond" means that the substituent may or may not include $-O-$ bonding. Examples of A2 include but are not limited to methylene, trimethylene, tetramethylene, 1-methyltrimethylene, pentamethylene, 2,2-dimethyltrimethylene, hexamethylene, heptamethylene, octamethylene, 2-oxotetramethylene, 2,5-dioxaheptamethylene, 2,5,8-trioxadecamethylene, 2-oxa-3-methyltetramethylene, 2,5-dioxa-3,6-dimethylheptamethylene, ethylene, and methylethylene. In the preferred embodiments of the present invention. A2 is methylene, trimethylene, hexamethylene, or 2-oxotetramethylene, and methylene is particularly preferred.

The manufacturing method of the compound of formula (I) is not particularly limited and is not critical to the present invention. Persons skilled in the art can select a suitable manufacturing method based on their ordinary skill depending on the need upon reading the disclosure of the present invention. Also, the compound of formula (I) is commercially available. For example, the compound of formula (I) can be prepared according to the method described in WO 2017/077846 A1, and the subject matters of which are incorporated herein in their entirety by reference. For instance, in the case that A1 is $*-C(=O)O-$, the compound of formula (I) can be manufactured by the following process: reacting a carboxylic acid represented by $R^{11}R^{12}R^{13}C-COOH$ or activated forms thereof (e.g., acyl halides, anhydrides, acyl azides, active esters, and the like) with an allyl halide or allyl-containing alcohol to form an ester compound having unsaturated bond(s) (an intermediate product), and then reacting the intermediate product with a peroxide to oxidize the unsaturated bonds. Alternatively, the compound of formula (I) can be manufactured via a ring-closure reaction by using a carboxylic acid represented by $R^{11}R^{12}R^{13}C-COOH$ and epichlorohydrin. In the appended Examples, a product with trade name FOLDI E101 available from NISSAN CHEMICAL INDUSTRIES is used, and the chemical name of FOLDI E101 is 2-(4,4-dimethyl-2yl)-5,7,7-trimethyl octanoic glycidyl ester.

In the resin composition of the present invention, based on 100 parts by weight of the epoxy resin (A), the amount of the compound (C) of formula (I) can range from about 10 parts by weight to about 85 parts by weight, and more specifically from about 12 parts by weight to about 80 parts by weight, such as 15 parts by weight, 20 parts by weight, 25 parts by weight, 30 parts by weight, 31 parts by weight, 32 parts by weight, 35 parts by weight, 40 parts by weight, 41 parts by weight, 45 parts by weight, 47 parts by weight, 50 parts by weight, 52 parts by weight, 55 parts by weight, 56 parts by weight, 59 parts by weight, 60 parts by weight, 62 parts by weight, 65 parts by weight. 68 parts by weight, 70 parts by weight, 72 parts by weight, 75 parts by weight, or 78 parts by weight. When the amount of the compound (C) of formula (I) is within the designated ranges, the compound (C) of formula (I) can effectively improve the dielectric characteristics of the electronic material prepared by the resin composition without adversely affecting the thermal resistance and mechanical properties of the electronic material.

Optional Constituents (D)

In the resin composition of the present invention, other constituents may be optionally contained. For example, co-hardeners, hardening promoters, and fillers as described below and additives well-known to persons with ordinary skill in the art can be added into the resin composition to improve the physicochemical properties of the electronic material manufactured by using the resin composition or to improve the processability of the resin composition during the manufacturing process. The additives well-known to persons with ordinary skill in the art include but are not limited to dispersing agents, tougheners, and flame retardants.

[Co-Hardener]

In the resin composition of the present invention, in addition to the amino group-containing hardener (B), other conventional hardeners which do not contain amino group and are suitable for epoxy resin can be further used as a co-hardener. The conventional hardeners include —OH group-containing compounds, anhydrides compounds, and active ester compounds. Examples of the co-hardener include but are not limited to cyanate ester resins, phenol novolac (PN), bismaleimide (BMI) resins, benzoxazine resins, active esters, styrene-vinyl phenol copolymers, and combinations thereof.

Generally, based on the dry weight of the resin composition, the amount of the co-hardener can range from about 0 wt % to about 25 wt %, such as 1 wt %, 3 wt %, 5 wt %, 7 wt %, 10 wt %, 12 wt %, 15 wt %, 17 wt %, 20 wt %, or 22 wt %. But the amount of the co-hardener is not limited to the designated range but can be adjusted depending on the need of persons with ordinary skill in the art.

[Hardening Promoter]

The resin composition of the present invention may further comprise a hardening promoter to promote the ring-opening reaction of epoxy functional groups and lower the curing reaction temperature of the resin composition. The type of the hardening promoter is not particularly limited as long as the hardening promoter can promote the ring-opening reaction of epoxy functional groups and lower the curing reaction temperature of the resin composition. The hardening promoters suitable for the present invention include but are not limited to tertiary amines, quaternary ammoniums, imidazoles, and pyridines. These hardening promoters can be used either alone or in combination. Examples of the hardening promoter include 2,3-diamino pyridine, 2,5-diamino pyridine, 2,6-diamino pyridine, 4-dimethylamino pyridine, 2-amino-3-methyl pyridine, 2-amino-4-methyl pyridine, and 2-amino-3-nitro pyridine, but the present invention is not limited thereto.

Generally, based on the dry weight of the resin composition, the amount of the hardening promoter can range from about 0 wt % to about 5 wt %, such as 0.01 wt 6, 0.03 wt %, 0.05 wt %, 0.07 wt %, 0.1 wt %, 0.3 wt %, 0.5 wt %, 0.7 wt %, 1 wt %, or 3 wt %. But the amount of the hardening promoter is not limited to the designated range but can be adjusted depending on the need of persons with ordinary skill in the art.

[Filler]

The resin composition of the present invention may further comprise a filler. The filler that is suitable for the present invention includes but is not limited to an organic filler or inorganic filler selected from the group consisting of silica (e.g., hollow silica), aluminum oxide, magnesium oxide, magnesium hydroxide, calcium carbonate, talc, clays, aluminum nitride, boron nitride, aluminum hydroxide, silicon aluminum carbide, silicon carbide, sodium carbonate, titanium dioxide, zinc oxide, zirconium oxide, quartzes, diamonds, diamond-like carbon, graphites, calcined kaolin, pryan, micas, hydrotalcite, PTFE powders, glass beads, ceramic whiskers, carbon nanotubes, nanosized inorganic powders, and combinations thereof.

Generally, based on the dry weight of the resin composition, the amount of the filler can range from 0 wt % to about 40 wt %, such as 2 wt %, 4 wt %, 6 wt %, 8 wt %, 10 wt %, 12 wt %, 14 wt %, 16 wt %, 18 wt %, 20 wt %, 22 wt %, 24 wt %, 26 wt %, 28 wt %. 30 wt %, 32 wt %, 34 wt %, 36 wt %, or 38 wt %. The amount of the filler is not limited to the designated range but can be adjusted depending on the need of persons with ordinary skill in the art.

[Flame Retardant]

The resin composition of the present invention may further comprise a flame retardant, such as a halogen-containing flame retardant or a halogen-free flame retardant, to improve the flame retardance of the electronic material manufactured thereby. When the resin composition of the present invention is required to be halogen-free, a halogen-free flame retardant may be used.

Examples of the halogen-free flame retardant include but are not limited to nitrogen-containing compounds, phosphorus-containing compounds, and metal phosphinates. Examples of nitrogen-containing compounds include but are not limited to melamines and derivatives thereof (e.g., a product with trade name Melapur 200 available from BASF Company). Examples of phosphorus-containing compounds include but are not limited to 9,10-dihydro-9-oxa-10-phosphahenanthrene-10-oxide (DOPO) and derivatives thereof (e.g., the product with trade name XZ-92741 available from DOW Chemical Company, and the product with trade name XP-7866 available from Albemarle Company), phenoxy cyclophosphazene (e.g., the product with trade name SPB-100) available from Otsuka Chemical Company), and resorcinol bis[di(2,6-dimethyl phenyl) phosphate] (e.g., the product with trade name PX-200 available from DAIHACHI Chemical Company). An example of metal phosphinates is aluminum phosphinate (e.g., the product with trade name OP-935 available from Clariant Company), but the present invention is not limited thereto.

The aforementioned flame retardants can be used either alone or in combination. Based on the dry weight of the resin composition, the amount of the flame retardant usually ranges from about 2 wt % to about 30 wt %, and preferably from about 5 wt % to about 25 w %. When the amount of the flame retardant is lower than the designated ranges (e.g., lower than 2 wt %), the flame retardance of the manufactured electronic material may be insufficient. When the amount of the flame retardant is higher than the designated ranges (e.g., higher than 30 wt %), the characteristics of the manufactured electronic material may be adversely affected.

For example, the electrical properties of the electronic material may deteriorate, the water absorption of the electronic material may increase, and the peeling strength of electronic material may decrease.

Preparation of Resin Composition

The resin composition of the present invention may be prepared into varnish form for subsequent applications by evenly mixing the constituents of resin composition (including the epoxy resin, the amino group-containing hardener, the compound of formula (I), and other optional constituents) through a stirrer and dissolving or dispersing the obtained mixture into a solvent. The solvent here can be any inert solvent that can dissolve or disperse the constituents of resin composition of the present invention, but does not react with the constituents. Examples of the solvent which can dissolve or disperse the constituents of the resin composition include but are not limited to toluene, γ-butyrolactone, methyl ethyl ketone, cyclohexanone, butanone, acetone, xylene, methyl isobutyl ketone, N,N-dimethylformamide (DMF), N,N-dimethylacetamide (DMAc), and N-methyl-pyrolidone (NMP). The listed solvents can be used either alone or in combination. The amount of the solvent is not particularly limited as long as the constituents of the resin composition can be evenly dissolved or dispersed therein. In the appended Examples, a mixture of toluene, methyl ethyl ketone and γ-butyrolactone is used as the solvent.

Prepreg

The present invention also provides a prepreg prepared from the abovementioned resin composition, wherein the prepreg is obtained by impregnating a substrate into the abovementioned resin composition or coating the aforementioned resin composition onto a substrate, and drying the impregnated or coated substrate. The substrate which is commonly used include glass fiber reinforcing materials (e.g., glass-fiber woven fabrics or non-woven fabrics, glass papers, and glass mats), kraft papers, short fiber cotton papers, nature fiber cloths, organic fiber cloths, and the like. In some embodiments of the present invention, 2116 glass fiber cloth are used as the reinforcing material (i.e., substrate), and the reinforcing material is heated and dried at 175° C. for 2 to 15 minutes (i.e., B-stage) to provide a semi-cured prepreg.

Metal-Clad Laminate and Printed Circuit Board

The present invention also provides a metal-clad laminate prepared from the abovementioned prepreg. The metal-clad laminate comprises a synthetic layer and a metal layer, wherein the synthetic layer is provided by the abovementioned prepregs. The metal-clad laminate may be prepared either by laminating the aforementioned prepregs with a metal foil or by coating the aforementioned resin composition onto a metal foil and drying the coated metal foil. In the case that the metal-clad laminate is prepared by using the prepregs, the metal-clad laminate may be prepared by the following process: (1) superimposing a plurality of the prepregs and then superimposing a metal foil (such as a copper foil) on at least one external surface of an dielectric layer composed of the superimposed prepregs to provide a superimposed object: and (2) performing a hot-pressing operation onto the superimposed object to obtain the metal-clad laminate.

Further, a printed circuit board may be prepared by patterning the external metal foil of the aforementioned metal-clad laminate.

The present invention will be further illustrated by the embodiments hereinafter, wherein the measuring instruments and methods are respectively as follows:

[Water Absorption Test]

The moisture resistance of the metal-clad laminate is tested by a pressure cooker test (PCT), i.e., subjecting the metal-clad laminate into a pressure container (121° C., saturated relative humidity (100% R.H.) and 1.2 atm) for 2 hours.

[Solder Resistance Test]

The solder resistance test is carried out by immersing the dried metal-clad laminate in a solder bath at 288° C. for a certain period and observing whether there is any defect such as delamination and blistering.

[Peeling Strength Test]

The peeling strength refers to the bonding strength between the metal foil and laminated prepreg, which is expressed by the force required for vertically peeling the clad copper foil with a width of ⅛ inch from the surface of the laminated prepreg in the peeling strength test.

[Glass Transition Temperature (Tg) Test]

The glass transition temperature (Tg) of the metal-clad laminate is measured by using a Differential Scanning Calorimeter (DSC), wherein the measuring methods are IPC-TM-650.2.4.25C and 24C testing method of the Institute for Interconnecting and Packaging Electronic Circuits (IPC).

[Coefficient of Thermal Expansion (CTE) Test]

The coefficient of thermal expansion (CTE) of the sample (a metal-clad laminate in a size of 3 mm$^2$) in thickness direction (i.e., z-axis direction) is tested by the thermal expansion analyzer of TA instrument company (model No.: TA 2940) between a temperature gap ranging from 50° C. to 260° C. (heating rate: 10° C./min).

[Flame Retardance Test]

The flame retardance test is carried out according to UL94V (Vertical Burn), which comprises the burning of a metal-clad laminate, which is held vertically, using a Bunsen burner to compare its self-extinguishing properties and combustion-supporting properties. The ranking for the flame retardance levels is V0>V1>V2.

[Dielectric Constant (Dk) and Dissipation Factor (Df) Measurement]

Dielectric constant (Dk) and dissipation factor (Df) of the metal-clad laminate are measured according to IPC-TM-650 under an operating frequency of 10 GHz. The resin content (RC) of the prepreg of the metal-clad laminate for test is about 53%.

[Moisture Absorption Solder Resistance Test]

The metal-clad laminate is subjected to PCT under 121° C., saturated relative humidity (100% R.H.) and 1.2 atm for 3 hours. The metal-clad laminate subjected to PCT is then immersed in a solder bath at 288° C. for 20 seconds. The immersion of the metal-clad laminate is repeated to evaluate the moisture absorption solder resistance by observing whether there is any popcorn phenomenon.

[Test of Wear Percentage on the Drill]

The wear percentage on the drill is tested by drilling the metal-clad laminate using a drill with a diameter of 0.3 mm, repeating the drilling operation 2000 times, and then observing the wear of the drill top surface. Since the cutting edge (CE) of the drill is maintained in contact with the metal-clad laminate and continuously worn, the cutting corner (CC) of the cutting edge CE will be worn. In this test, the wear percentage on the drill is obtained by measuring the wear percentage of the cutting corner CC.

[Metal-Clad Laminate Warpage Test]

The metal-clad laminate is subjected to reflow at 260° C. for 10 second by using an IR REFLOW machine. The warpage of the metal-clad laminate is measured in accordance with IPC-TM-650.2.4.22 testing method after the metal-clad laminate has been subjected to reflow for six times.

EXAMPLES

[Preparation of Resin Composition]

Example 1

According to the ratio shown in Table 1, an epoxy resin (trade name: BNE 210, available from Chang Chun Plastics Co., Ltd.; solid content: 80%), an amino group-containing hardener DDS (available from AULT Company), a compound of formula (I) (trade name: FOLDI E101, available from NISSAN CHEMICAL), $SiO_2$ filler (trade name: G2C, available from Sibelco), a DOPO-based phosphorus-containing flame retardant (DOPO-containing bisphenol A phenolic resin: trade name: XZ-92741, available from DOW CHEMICAL; solid content: 55%), and 2-ethyl-4-methyl imidazole (2E4MZ: available from UNION CHEMICAL IND. CO., LTD) as a hardening promoter were mixed under room temperature with a stirrer followed by adding toluene, methyl ethyl ketone and γ-butyrolactone (all available from Fluka Company) thereinto. After stirring the resultant mixture under room temperature for 60 to 120 minutes, resin composition 1 was obtained.

Example 2

The preparation procedures of resin composition 1 were repeated to prepare resin composition 2, except that the amounts of the compound of formula (I), the filler and the flame retardant were adjusted as shown in Table 1.

Example 3

The preparation procedures of resin composition 1 were repeated to prepare resin composition 3, except that the amounts of the compound of formula (I), the filler and the flame retardant were adjusted as shown in Table 1.

Example 4

The preparation procedures of resin composition 1 were repeated to prepare resin composition 4, except that the amounts of the compound of formula (I), the filler, the flame retardant and the hardening promoter were adjusted as shown in Table 1.

Example 5

According to the ratio shown in Table 1, an epoxy resin (trade name: 1154, available from HEXION Company, solid content: 85%), the amino group-containing hardener DDS, the compound of formula (I) FOLDI E101, $SiO_2$ filler, tetrabromo bisphenol A flame retardant (trade name: FR 1524, available from UNION CHEMICAL), and the hardening promoter 2E4MZ were mixed under room temperature with a stirrer followed by adding toluene, methyl ethyl ketone and γ-butyrolactone thereinto. After stirring the resultant mixture under room temperature for 60 to 120 minutes, resin composition 5 was obtained.

Example 6

The preparation procedures of resin composition 5 were repeated to prepare resin composition 6, except that the amounts of the compound of formula (I), the filler and the flame retardant were adjusted as shown in Table 1.

Example 7

According to the ratio shown in Table 1, the epoxy resin BNE-210, the epoxy resin 1154, an amino group-containing hardener DICY (available from DEGUSSA Company, solid content: 9%), the compound of formula (I) FOLDI E101. $SiO_2$ filler, tetrabromo bisphenol A flame retardant FR 1524, and the hardening promoter 2E4MZ were mixed under room temperature with a stirrer followed by adding toluene, methyl ethyl ketone and γ-butyrolactone thereinto. After stirring the resultant mixture under room temperature for 60 to 120 minutes, resin composition 7 was obtained.

Example 8

The preparation procedures of resin composition 7 were repeated to prepare resin composition 8, except that the amounts of the compound of formula (I), the filler and the flame retardant were adjusted as shown in Table 1.

Comparative Example 1

The preparation procedures of resin composition 1 were repeated to prepare comparative resin composition 1, except that the compound of formula (I) FOLDI E101 was not added as shown in Table 2.

Comparative Example 2

The preparation procedures of resin composition 3 were repeated to prepare comparative resin composition 2, except that the amino group-containing hardener DDS was substituted by styrene maleic anhydride copolymer (SMA; anhydride hardener; trade name: EF-40, available from CRAY VALLEY Company) as shown in Table 2.

Comparative Example 3

The preparation procedures of resin composition 5 were repeated to prepare comparative resin composition 3, except that the compound of formula (I) FOLDI E101 and the flame retardant were not added, and the amount of the filler was adjusted as shown in Table 2.

Comparative Example 4

The preparation procedures of resin composition 7 were repeated to prepare comparative resin composition 4, except that the compound of formula (I) FOLDI E101 and the flame retardant were not added, and the amounts of the filler and the hardening promoter were adjusted as shown in Table 2.

TABLE 1

Composition of resin compositions

| | | Example | | | | | | | |
|---|---|---|---|---|---|---|---|---|---|
| Unit: parts by weight | | 1 | 2 | 3 | 4 | 5 | 6 | 7 | 8 |
| Epoxy resin | BNE-210 | 125 | 125 | 125 | 125 | | | 30 | 30 |
| | 1154 | | | | | 118 | 118 | 118 | 118 |

TABLE 1-continued

Composition of resin compositions

| Unit: parts by weight | | Example | | | | | | | |
|---|---|---|---|---|---|---|---|---|---|
| | | 1 | 2 | 3 | 4 | 5 | 6 | 7 | 8 |
| Amino group-containing hardener | DDS | 29 | 29 | 29 | 29 | 29 | 29 | | |
| | DICY | | | | | | | 30 | 30 |
| Compound of formula (1) | FOLDI E101 | 15 | 40 | 70 | 100 | 53 | 70 | 45 | 60 |
| Filler | G2C | 60 | 75 | 90 | 100 | 60 | 50 | 48 | 52 |
| Flame retardant | XZ-92741 | 91 | 115 | 132 | 152 | | | | |
| | FR-1524 | | | | | 30 | 35 | 23 | 30 |
| Hardening promoter | 2E4MZ | 0.5 | 0.5 | 0.5 | 0.1 | 0.1 | 0.1 | 0.1 | 0.1 |

TABLE 2

Composition of comparative resin compositions

| Unit: parts by weight | | Comparative examples | | | |
|---|---|---|---|---|---|
| | | 1 | 2 | 3 | 4 |
| Epoxy resin | BNE-210 | 125 | 125 | | 30 |
| | 1154 | | | 118 | 118 |
| Amino group-containing hardener | DDS | 29 | | 29 | |
| | DICY | | | | 30 |
| Hardener without amino group | SMA | | 29 | | |
| Compound of formula (I) | FOLDI E101 | | 70 | | |
| Filler | G2C | 60 | 90 | 42 | 30 |
| Flame retardant | XZ-92741 | 91 | 132 | | |
| | FR-1524 | | | | |
| Hardening promoter | 2E4MZ | 0.5 | 0.5 | 0.1 | 0.05 |

[Preparation of Metal-Clad Laminate]

Metal-clad laminates 1 to 8 and comparative metal-clad laminates 1 to 4 were prepared by using resin compositions 1 to 8 and comparative resin compositions 1 to 4, respectively. First, glass fiber cloths (trade name: 2116, thickness: 0.08 mm) were respectively impregnated into resin compositions 1 to 8 and comparative resin compositions 1 to 4 by means of a roller coating machine. The thickness of the glass fiber cloths was controlled to an appropriate extent. Next, the impregnated glass fiber cloths were placed in an oven and heated and dried at 175° C. for 2 to 15 minutes to produce prepregs in a semi-cured state (B-stage) (resin content of the prepregs: about 53%). Afterwards, four pieces of the prepregs were superimposed and two sheets of copper foil (0.5 oz.) were respectively superimposed on both of the two outer surfaces of the superimposed prepregs to provide a superimposed object. A hot-pressing operation was performed on each of the prepared objects to provide metal-clad laminates 1 to 8 (corresponding to resin compositions 1 to 8, respectively) and comparative metal-clad laminates 1 to 4 (corresponding to comparative resin compositions 1 to 4, respectively). Herein, the hot-pressing conditions are as follows: raising the temperature to about 200° C. to 220° C. with a heating rate of 3.0° C./min, and hot-pressing for 180 minutes under a full pressure of 15 kg/cm² (initial pressure is 8 kg/cm²) at said temperature.

The water absorption, solder resistance, peeling strength, glass transition temperature (Tg), coefficient of thermal expansion (CTE), flame retardance, dielectric constant (Dk), dissipation factor (Df), moisture absorption solder resistance, warpage, and wear percentage on the drill of metal-clad laminates 1 to 6 and comparative metal-clad laminates 1 to 4 were analyzed, and the results are tabulated in Tables 3 and 4.

TABLE 3

Properties of metal-clad laminates

| | Unit | Metal-clad laminate | | | | | | | |
|---|---|---|---|---|---|---|---|---|---|
| | | 1 | 2 | 3 | 4 | 5 | 6 | 7 | 8 |
| Water absorption | % | 0.58 | 0.58 | 0.59 | 0.58 | 0.39 | 0.38 | 0.41 | 0.40 |
| Solder resistance | minute | >10 | >10 | >10 | >10 | >10 | >10 | >10 | >10 |
| Peeling strength | pound/inch | 5.9 | 5.8 | 5.7 | 5.6 | 6 | 5.6 | 6.7 | 6.2 |
| Tg | ° C. | 200 | 195 | 180 | 170 | 173 | 160 | 181 | 162 |
| CTE | % | 2 | 2.2 | 2.5 | 2.7 | 2.7 | 3.1 | 2.3 | 3.2 |
| Flame retardance | UL grade | V0 | V0 | V0 | V0 | V0 | V0 | V0 | V0 |
| Df @ 10 GHz | | 4.2 | 4.2 | 4.2 | 4.2 | 4.1 | 4.1 | 4.1 | 4.1 |
| Dk @ 10 GHz | | 0.017 | 0.016 | 0.015 | 0.015 | 0.018 | 0.018 | 0.017 | 0.017 |
| Moisture absorption solder resistance | times | >20 | >20 | 12 | 5 | >20 | 10 | >20 | 13 |

TABLE 3-continued

Properties of metal-clad laminates

| | | Metal-clad laminate | | | | | | | |
|---|---|---|---|---|---|---|---|---|---|
| | Unit | 1 | 2 | 3 | 4 | 5 | 6 | 7 | 8 |
| Wear percentage on the drill | % | 62 | 59 | 53 | 49 | 47 | 44 | 42 | 40 |
| Warpage | % | 9.20 | 4.20 | 4.30 | 4.0 | 3.80 | 3.70 | 4.12 | 4.03 |

TABLE 4

Properties of comparative metal-clad laminates

| | | Comparative metal-clad laminate | | | |
|---|---|---|---|---|---|
| | Unit | 1 | 2 | 3 | 4 |
| Water absorption | % | 0.58 | 0.58 | 0.42 | 0.42 |
| Solder resistance | minute | >10 | >10 | >10 | >10 |
| Peeling strength | pound/inch | 6.3 | 4.5 | 6.7 | 7.1 |
| Tg | ° C. | 200 | 160 | 190 | 197 |
| CTE | % | 2.0 | 3.7 | 2.3 | 2.0 |
| Flame retardance | UL grade | V0 | V0 | V0 | V0 |
| Df @ 10 GHz | | 4.2 | 4 | 4.1 | 4.1 |
| Dk @ 10 GHz | | 0.018 | 0.013 | 0.02 | 0.019 |
| Moisture absorption solder resistance | times | >20 | 6 | >20 | >20 |
| Wear percentage on the drill | % | 65 | 52 | 58 | 52 |
| Warpage | % | 23.60 | 4.90 | 21.70 | 22.60 |

As shown in Table 3, the electronic material (i.e., metal-clad laminates 1 to 8) manufactured by using the resin compositions of the present invention are provided with satisfactory physicochemical properties and electrical properties (such as water absorption, thermal resistance, thermal expansion percentage, flame retardance, Dk, Df, and the like), and low wear percentage on the drill and low warpage (lower than 9.20%). In this respect, as shown in Examples 1 to 4, increasing the amount of the compound of formula (I) makes the Df, wear percentage on the drill and warpage of the resultant metal-clad laminates lower but deteriorates the thermal resistance (e.g., Tg, moisture absorption solder resistance) of the metal-clad laminates. Therefore, in view of the balance of properties of the metal-clad laminate, based on 100 parts by weight of the epoxy resin, it is desirable that the amount of the compound of formula (I) ranges from about 12 parts by weight to about 40 parts by weight. Furthermore, as shown in Examples 5 to 8, although different types of epoxy resin, amino group-containing hardener, and flame retardant are used, the resultant laminates still have satisfactory physicochemical properties and electrical properties, low wear percentage on the drill and warpage as long as the amount of the compound of formula (I) is within the aforementioned range and the epoxy resin and the amino group-containing hardener are properly used.

In contrast, as shown in Table 4, the electronic materials (i.e., comparative metal-clad laminates 1 to 4) manufactured by using resin compositions that are not according to the present invention do not have satisfactory physicochemical properties and electrical properties, acceptable wear percentage on the drill and acceptable warpage. Specifically, when the resin composition does not comprise the compound of formula (I), like Comparative examples 1, 3 and 4, the resultant metal-clad laminate has too high of a wear percentage on the drill and warpage (up to 21.70%) and also too high of a Df. Although the metal-clad laminate prepared in Comparative example 2 which uses the compound of formula (I) is provided with improved wear percentage on the drill and warpage, it is surprising that though the only difference between Example 3 and Comparative example 2 is the type of hardener, the metal-clad laminate prepared in Comparative Example 2 which uses an anhydride hardener is totally inferior to the metal-clad laminate prepared in Example 3 which uses an amino group-containing hardener in terms of peeling strength, glass transition temperature (Tg), coefficient of thermal expansion (CTE), and moisture absorption solder resistance. This result clearly manifests that the technical means of the present invention, i.e., using an epoxy resin, a compound of formula (I) and an amino group-containing hardener in combination, definitely provide an unpredictable synergistic effect.

The above examples are used to illustrate the principle and efficacy of the present invention and show the inventive features thereof. People skilled in this field may proceed with a variety of modifications and replacements based on the disclosures and suggestions of the invention as described without departing from the principle and spirit thereof. Therefore, the scope of protection of the present invention is that as defined in the claims as appended.

What is claimed is:

1. A resin composition, comprising:
(A) an epoxy resin, wherein the epoxy resin is selected from the group consisting of phenol phenolic epoxy resins, cresol phenolic epoxy resins, bisphenol A phenolic epoxy resins, and bisphenol F phenolic epoxy resins;
(B) an amino group-containing hardener, and the amino group-containing hardener (B) is diamino diphenylsulfone (DDS) or dicyandiamide (DICY); and
(C) a compound of the following formula (I):

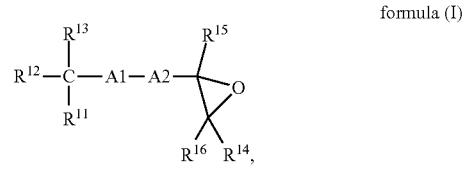

in formula (I),
$R^{11}$ is H, $R^{12}$ and $R^{13}$ are independently 4,4-dimethylpentane-2-yl, 6-methylheptane-2-yl, 6-methyloctyl, 3,5,5-trimethylhexyl, or 3,7-dimethyloctyl, and the total carbon number of $-CR^{11}R^{12}R^{13}$ is 14 to 20;
$R^{14}$, $R^{15}$ and $R^{16}$ are independently H;
A1 is *—C(=O)O— or *—CH$_2$O—, wherein * indicates the end bonded to —CR$^{11}$R$^{12}$R$^{13}$; and
A2 is is methylene, trimethylene, hexamethylene or 2-oxatetramethylene, wherein based on 100 parts by weight of the epoxy resin (A), the amount of the compound (C) of formula (I) is 12 parts by weight to about 80 parts by weight, wherein based on the dry weight of the resin composition, the amount of the amino group-containing hardener (B) ranges from about 7 wt % to about 11 wt %.

2. The resin composition of claim 1, further comprising a co-hardener selected from the group consisting of cyanate ester resins, phenol novolac (PN), bismaleimide (BMI) resins, benzoxazine resins, active esters, styrene-vinyl phenol copolymers, and combinations thereof.

3. The resin composition of claim 1, further comprising a hardening promoter.

4. The resin composition of claim 1, further comprising a filler selected from the group consisting of silica, aluminum oxide, magnesium oxide, magnesium hydroxide, calcium carbonate, talc, clays, aluminum nitride, boron nitride, aluminum hydroxide, silicon aluminum carbide, silicon carbide, sodium carbonate, titanium dioxide, zinc oxide, zirconium oxide, quartzes, diamonds, diamond-like carbon, graphites, calcined kaolin, pryan, micas, hydrotalcite, polytetrafluoroethylene (PTFE) powders, glass beads, ceramic whiskers, carbon nanotubes, nanosized inorganic powders, and combinations thereof.

5. The resin composition of claim 1, further comprising an additive selected from the group consisting of dispersing agents, tougheners, flame retardants, and combinations thereof.

6. A prepreg, which is prepared by impregnating or coating a substrate with the resin composition of claim 1 and drying the impregnated or coated substrate.

7. A metal-clad laminate, which is prepared by laminating the prepreg of claim 6 and a metal foil.

8. A printed circuit board, which is prepared from the metal-clad laminate of claim 2.

9. A metal-clad laminate, which is prepared by coating the resin composition of claim 1 onto a metal foil and drying the coated metal foil.

10. A printed circuit board, which is prepared from the metal-clad laminate of claim 9.

* * * * *